(12) United States Patent
Wu

(10) Patent No.: US 9,535,470 B2
(45) Date of Patent: Jan. 3, 2017

(54) ELECTRONIC SUBSTRATE WITH HEAT DISSIPATION STRUCTURE

(71) Applicant: ASIA VITAL COMPONENTS CO., LTD., New Taipei (TW)

(72) Inventor: Chun-Ming Wu, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 185 days.

(21) Appl. No.: 14/322,906

(22) Filed: Jul. 2, 2014

(65) Prior Publication Data

US 2016/0007504 A1    Jan. 7, 2016

(51) Int. Cl.
| H05K 7/00 | (2006.01) |
| H05K 5/00 | (2006.01) |
| G11B 33/02 | (2006.01) |
| G06F 1/20 | (2006.01) |
| H05K 1/02 | (2006.01) |

(52) U.S. Cl.
CPC ............. *G06F 1/203* (2013.01); *H05K 1/0203* (2013.01); *H05K 1/0272* (2013.01)

(58) Field of Classification Search
CPC ...................................................... G06F 1/203
USPC ........................................ 361/679.01–679.03
See application file for complete search history.

(56) References Cited

U.S. PATENT DOCUMENTS

| 7,493,939 B2 | 2/2009 | Xia et al. |
| 7,535,712 B2 * | 5/2009 | Tanaka ................... G06F 1/203 165/104.26 |
| 2008/0030961 A1 * | 2/2008 | Koo .................... H05K 1/0216 361/720 |
| 2012/0085520 A1 | 4/2012 | Pfaffinger |
| 2014/0116656 A1 | 5/2014 | Yang |

FOREIGN PATENT DOCUMENTS

| CN | 2405264 Y | 11/2000 |
| CN | 2665919 Y | 12/2004 |
| CN | 102023689 A | 4/2011 |
| CN | 103796491 A | 5/2014 |
| TW | M343151 U | 10/2008 |
| TW | M393716 U | 12/2010 |
| TW | 201100713 A | 1/2011 |
| TW | M411550 U | 9/2011 |
| TW | M449938 U | 4/2013 |
| TW | M451797 U | 4/2013 |
| TW | M459692 U | 8/2013 |
| TW | M486933 U | 9/2014 |

* cited by examiner

*Primary Examiner* — Jerry Wu
(74) *Attorney, Agent, or Firm* — C. G. Mersereau; Nikolai & Mersereau, P.A.

(57) ABSTRACT

An electronic substrate with heat dissipation structure includes a substrate plate and at least one heat pipe. The substrate plate includes a wiring layer, a grounding layer and an insulation layer from top to bottom. The wiring layer has at least one heat-producing element mounted thereon, and is formed with a receiving hole for the heat pipe to tightly fit therein. Heat produced by the heat-producing element and distributed over a high-temperature zone of the substrate plate surrounding the heat-producing element is absorbed by the heat pipe and then transferred to a low-temperature zone of the substrate plate distant from the heat-producing element, from where the heat is dissipated into ambient air to achieve cooling effect at upgraded heat dissipation efficiency.

3 Claims, 9 Drawing Sheets

ELECTRONIC SUBSTRATE WITH HEAT DISSIPATION STRUCTURE

FIELD OF THE INVENTION

The present invention relates to an electronic substrate, and more particularly to an electronic substrate that is provided with a heat dissipation structure to enable upgraded heat dissipation efficiency without increasing an overall thickness of the electronic substrate.

BACKGROUND OF THE INVENTION

As a result of the constant progress in the electronic technological fields and the demands of users on the compact design and high operating performance of hand-held electronic devices, such as mobile phones, tablet computers, personal digital assistants (PDAs) and so on, electronic elements in the hand-held electronic devices, such as the central processing unit (CPU) and integrated circuits (ICs), produce a large amount of heat during high-speed operation thereof. The produced heat tends to accumulate in the very limited internal space of the compact electronic devices, and must be timely removed to ensure good operating efficiency and extended service life of the electronic elements.

The currently available hand-held electronic devices usually include a case, a heat-producing element, and a metal-made heat-transfer plate serving as a heat dissipation structure. The case internally defines a chamber for accommodating the heat-producing elements, such as the CPU, various ICs or other electronic parts. The heat-transfer plate is directly attached to one side of each heat-producing element. Heat produced by the heat-producing element is transferred from the heat-producing element to the heat-transfer plate and is finally dissipated into ambient air from the heat-transfer plate. However, the conventional heat-transfer plate designed for the hand-held electronic devices has relatively poor heat dissipation effect. This is because, with the heat-transfer plate directly attached to the heat-producing element, the produced heat tends to accumulate on a high-temperature zone, i.e. areas of the heat-transfer plate that surround the heat-producing element, instead of being distributed over the whole heat-transfer plate. Therefore, the conventional hand-held electronic devices have poor heat dissipation efficiency.

It is therefore tried by the inventor to develop an electronic substrate with heat dissipation structure that has small thickness but upgraded heat dissipation efficiency.

SUMMARY OF THE INVENTION

A primary object of the present invention is to provide an electronic substrate with heat dissipation structure, which has upgraded heat dissipation efficiency but low structural thickness.

Another object of the present invention is to provide an electronic substrate with heat dissipation structure, which occupies only a very small space in an electronic device.

A further object of the present invention is to provide an electronic substrate with heat dissipation structure, which effectively prevents heat produced by a heat-producing element mounted thereon from accumulating in areas surrounding the heat-producing element, enabling the heat-producing element to operate at high efficiency and have extended service life.

To achieve the above and other objects, the electronic substrate with heat dissipation structure according to a preferred embodiment of the present invention includes a substrate plate and at least one heat pipe. The substrate plate includes a wiring layer, a grounding layer and an insulation layer. The wiring layer has a first side surface and an opposite second side surface, and is provided with a receiving hole. The first side surface has at least one heat-producing element mounted thereon. The receiving hole provided on the wiring layer is extended from a position in the vicinity of the heat-producing element to another position distant from the heat-producing element while penetrating the first and the second side surface of the wiring layer. The grounding layer has an upper side facing toward the wiring layer and attached to the second side surface, and a lower side facing away from the wiring layer. The insulation layer has an upper side facing toward and attached to the lower side of the grounding layer, and a lower side facing away from the grounding layer. The heat pipe is tightly fitted in the receiving hole with a lower surface of the heat pipe in full contact with the upper side of the grounding layer. The heat pipe includes a heat-absorption section and a heat-transfer section extended from the heat-absorption section; the heat-absorption section is fitted in a portion of the receiving hole located adjacent to the heat-producing element, and the heat-transfer section is fitted in another portion of the receiving hole located distant from the heat-producing element. With these arrangements, heat produced by the heat-producing element does not accumulate on areas of the substrate plate surrounding the heat-producing element to thereby achieve cooling effect at upgraded heat dissipation efficiency without increasing the substrate plate thickness.

To achieve the above and other objects, the electronic substrate with heat dissipation structure according to another preferred embodiment of the present invention includes a substrate plate and at least one heat pipe. The substrate plate includes a wiring layer, a grounding layer and an insulation layer. The wiring layer has a first side surface and an opposite second side surface, and the first side surface has at least one heat-producing element mounted thereon. The grounding layer has an upper side facing toward the wiring layer and attached to the second side surface, and a lower side facing away from the wiring layer. The insulation layer has an upper side facing toward and attached to the lower side of the grounding layer and a lower side facing away from the grounding layer, and is provided with a receiving hole. The receiving hole provided on the insulation layer is extended from a position corresponding to the heat-producing element to another position distant from the heat-producing element while penetrating the upper and the lower side of the insulation layer. The heat pipe is tightly fitted in the receiving hole with an upper surface of the heat pipe in full contact with the lower side of the grounding layer. The heat pipe includes a heat-absorption section and a heat-transfer section extended from the heat-absorption section. The heat-absorption section is fitted in a portion of the receiving hole that is located corresponding to the heat-producing element, and the heat-transfer section is fitted in another portion of the receiving hole that is located distant from the heat-producing element. With these arrangements, heat produced by the heat-producing element does not accumulate on areas of the substrate plate surrounding the heat-producing element to thereby achieve cooling effect at upgraded heat dissipation efficiency without increasing the substrate plate thickness.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
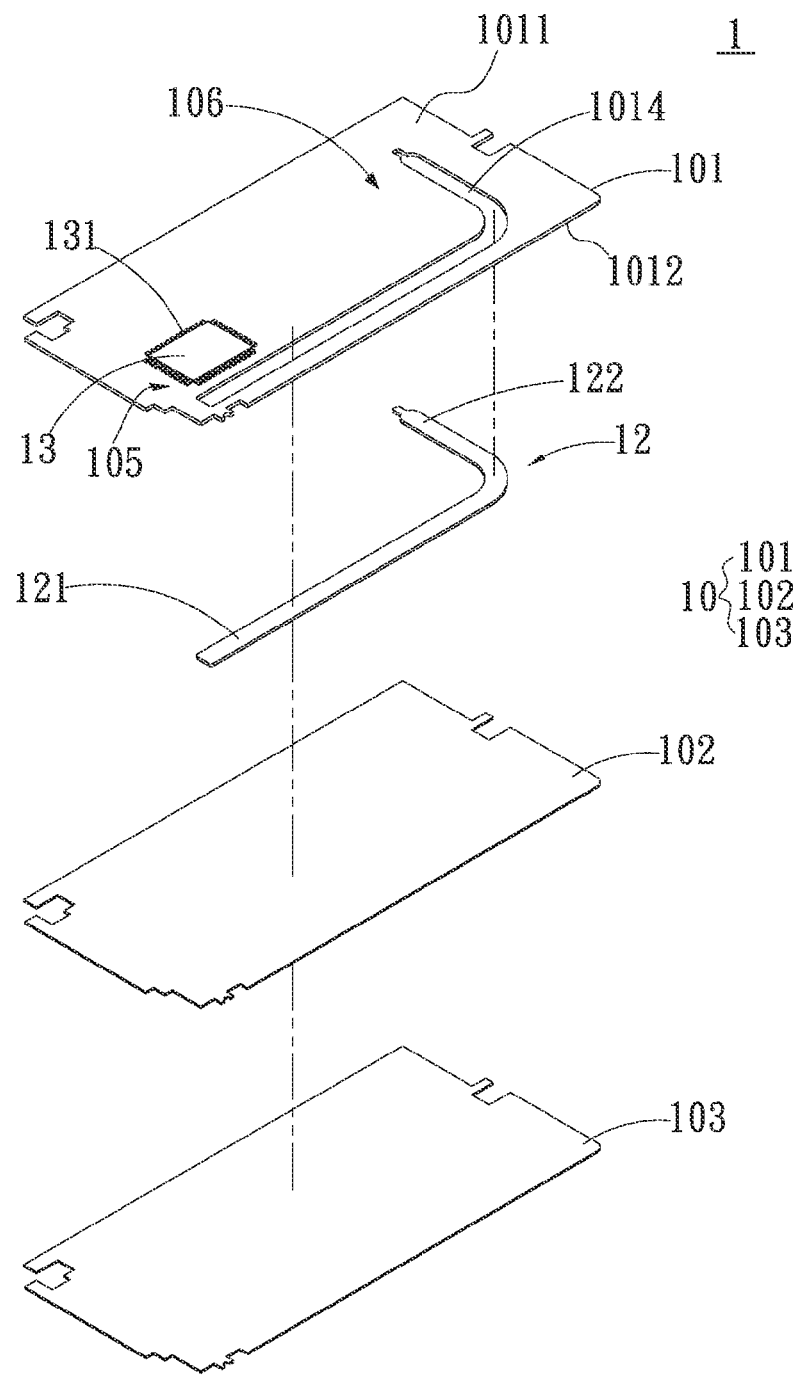
FIG. 1 is an exploded perspective view of an electronic substrate with heat dissipation structure according to a first preferred embodiment of the present invention.

The present invention will now be described with some preferred embodiments thereof and with reference to the accompanying drawings. For the purpose of easy to understand, elements that are the same in the preferred embodiments are denoted by the same reference numerals.

Figure 2:
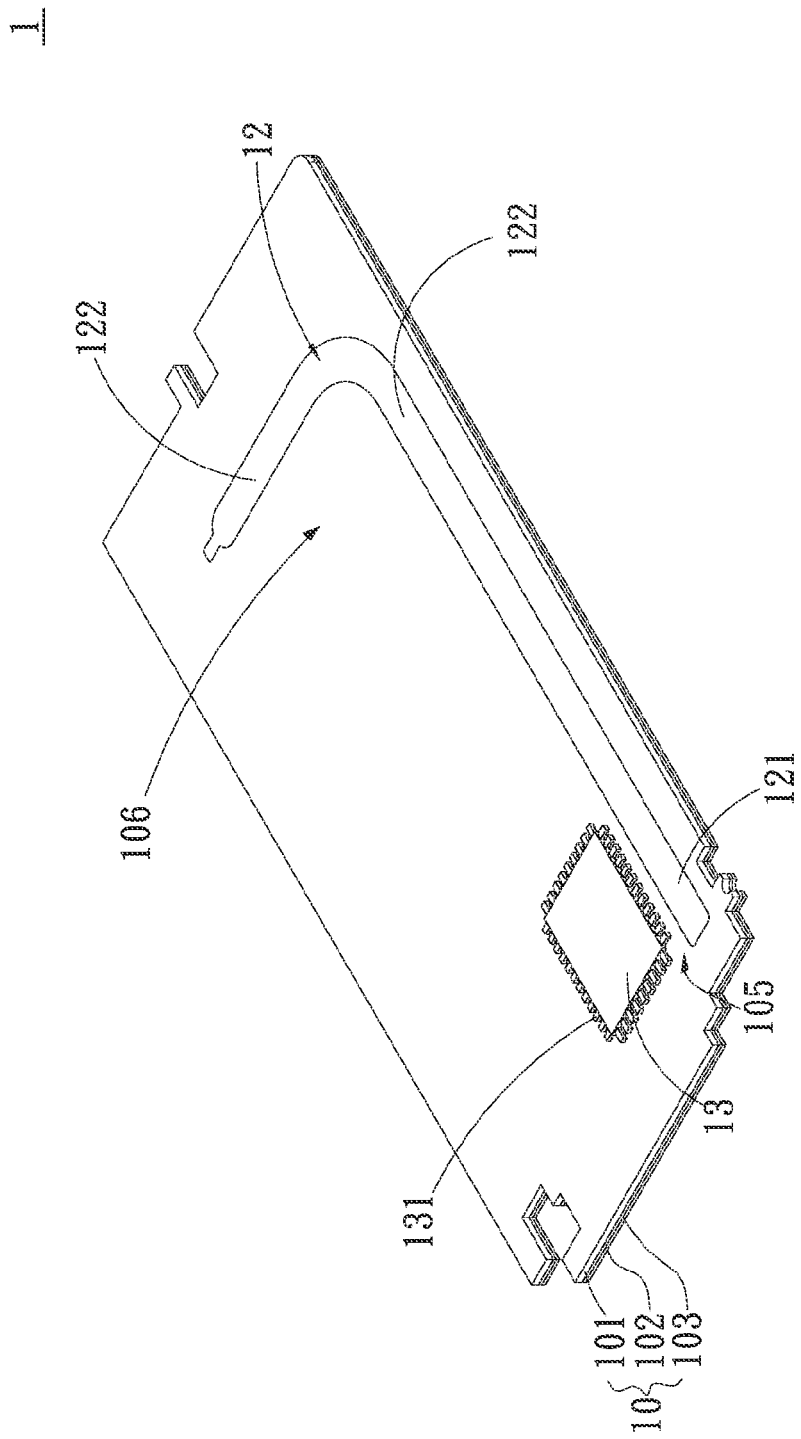
FIG. 2 is an assembled view of FIG. 1.
Figure 3:
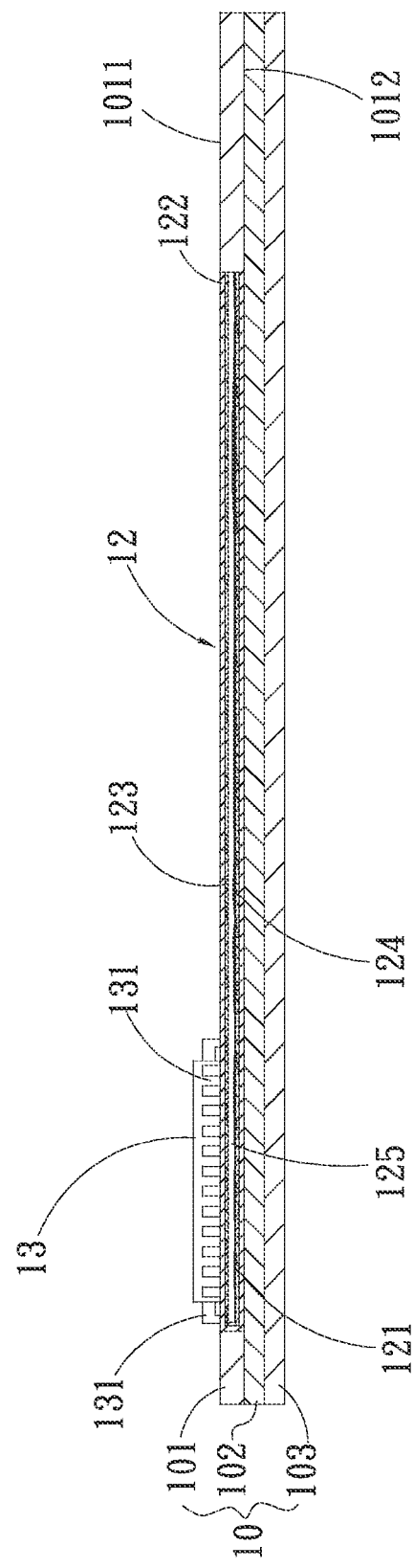
FIG. 3 is a sectional view of FIG. 2.

Please refer to FIG. 1 that is an exploded perspective view of an electronic substrate with heat dissipation structure according to a first preferred embodiment of the present invention, and to FIGS. 2 and 3 that are assembled perspective and sectional views, respectively, of the first preferred embodiment. For the purpose of conciseness, the electronic substrate with heat dissipation structure according to the present invention is also briefly referred to as the electronic substrate herein and generally denoted by reference numeral 1. As shown, the electronic substrate 1 includes a substrate plate 10 and at least one heat pipe 12. In the present invention, the substrate plate 10 includes, but not limited to, a printed circuit board (PCB). The substrate plate 10 includes a wiring layer 101, a grounding layer 102 and an insulation layer 103. The wiring layer 101 has a first side surface 1011 and an opposite second side surface 1012, and is provided with a receiving hole 1014. On the first side surface 1011, there is mounted at least one heat-producing element 13, which includes, but not limited to, a processor. In practical implementation of the present invention, the heat-producing element 13 can be an integrated circuit (IC), for example, such as a metal-oxide-semiconductor field-effect transistor (MOSFET). The second side surface 1012 is attached to one side of the grounding layer 102 that faces toward the wiring layer 101 and is defined as an upper side of the grounding layer 102 herein.

The heat-producing element 13 includes a semiconductor main body having a plurality of leads 131 extended beyond outer edges thereof. Some of the leads 131 are extended through the first and second side surfaces 1011, 1012 of the wiring layer 101 to connect to the upper side of the grounding layer 102, while others not. Areas of the wiring layer 101 that surround the heat-producing element 13 form at least one high-temperature zone 105, and other areas of the wiring layer 101 that are located outside the areas surrounding the heat-producing element 13 form a low-temperature zone 106. That is, areas of the wiring layer 101 other than the at least one high-temperature zone 105 and located farther from the heat-producing element 13 is a low-temperature zone 106.

The receiving hole 1014 is formed on the wiring layer 101 to extend from a position in the vicinity of the heat-producing element 13 to another position distant from the heat-producing element 13. More specifically, as shown in FIG. 1, the receiving hole 1014 on the wiring layer 101 has a beginning end located near the heat-producing element 13 and extends along a longitudinal edge of the wiring layer 101 to a transverse edge of the wiring layer 101 farther away from the heat-producing element 13. The receiving hole 1014 extends through the first and the second side surface 1011, 1012 of the wiring layer 101, and is shaped for receiving the heat pipe 12 therein.

The grounding layer 102 is formed of a metal material, such as a copper material. Another side of the grounding layer 102 opposite to the wiring layer 101 is defines as a lower side thereof, which faces toward and is attached to an upper side of the insulation layer 103. The heat pipe 12 is tightly fitted in the receiving hole 1014 with a lower surface in full contact with the upper side of the grounding layer 102. That is, the heat pipe 12 received in the receiving hole 1014 has a lower surface flush with the second side surface 1012 of the wiring layer 101, such that both of the second side surface 1012 of the wiring layer 101 and the lower surface of the heat pipe 12 are attached to the upper side of the grounding layer 102.

In the present invention, the heat pipe 12 is preferably a slim-type flat heat pipe, which internally defines a chamber 125 and includes a heat-absorption section 121, a heat-transfer section 122 extended from the heat-absorption section 121, and a wick structure 123 provided in the chamber 125. According to a preferred embodiment of the present invention, the wick structure 123 is in the form of a sintered powder structure. In other operable embodiments, the wick structure 123 can be a woven structure, a porous structure, a plurality of grooves, or any other structure that provides a capillary force. A working fluid 124 is filled in the chamber 125 of the heat pipe 12. The heat-absorption section 121 of the heat pipe 12 is fitted in a portion of the receiving hole 1014 located adjacent to one side of the heat-producing element 13, and the heat-transfer section 122 of the heat pipe 12 is fitted in another portion of the receiving hole 1014 located distant from the heat-producing element 13. In other words, the heat-absorption section 121 is located in the high-temperature zone 105 of the wiring layer 101 while the heat-transfer section 122 is located in the low-temperature zone 106. By tightly fitting the heat pipe 12 in the receiving hole 1014 of the wiring layer 101 in the above-described manner, the heat pipe 12 and the substrate plate 10 are associated with each other to form an integral unit. While there is only one heat pipe 12 shown in the illustrated preferred embodiments of the present invention, it is understood that, in practical implementation of the present invention, more than one receiving hole 1014 and more than one heat pipe 12 can be provided in a number corresponding to that of the heat-producing elements 13.

When the heat pipe 12 is fitted in the receiving hole 1014 on the wiring layer 101 of the substrate plate 10 to extend from the high-temperature zone 105 surrounding the heat-producing element 13 to the low-temperature zone 106, the electronic substrate 1 can include a slim-type heat dissipation structure without occupying an increased space or having an increased structural thickness.

According to the present invention, both of the heat-absorption section 121 and the heat-transfer section 122 of the heat pipe 12 have a lower surface flatly attached to the upper side of the grounding layer 102, and an upper surface flush with or slightly lower than the first side surface 1011 of the wiring layer 101. Thus, when the heat-producing element 13 produces heat, a large part of the produced heat is transferred to the grounding layer 102 via the leads 131 of the heat-producing element 13. The heat-absorption section 121 of the heat pipe 12 located in the high-temperature zone 105 and in full contact with the grounding layer 102 absorbs the heat transferred to the grounding layer 102, and the absorbed heat is quickly transferred to the heat-transfer section 122 located in the low-temperature zone 106. Meanwhile, heat transferred to areas of the wiring layer 101 surrounding the heat-producing element 13 is also absorbed by the heat-absorption section 121 and then transferred to the heat-transfer section 122. The heat transferred to the heat-transfer section 122 is then quickly transferred to the low-temperature zone 106 of the substrate plate 10 to dissipate into ambient air. That is, the heat produced by the heat-producing element 13 can be evenly transferred to the whole substrate plate 10, which provides a relatively large area to enable more efficient heat dissipation and accordingly, prevents heat from accumulating on the heat-producing element 13. With the above arrangements, the electronic substrate 1 enables the heat-producing element 13 to have upgraded operating efficiency and extended service life.

In brief, by fitting the heat pipe 12 in the substrate plate 10 to form an integral electronic substrate 1 with heat dissipation structure, the present invention enables an electronic device using the electronic substrate 1 to have a slim body that occupies a reduced room while has effectively upgraded heat dissipation efficiency.

Figure 4:
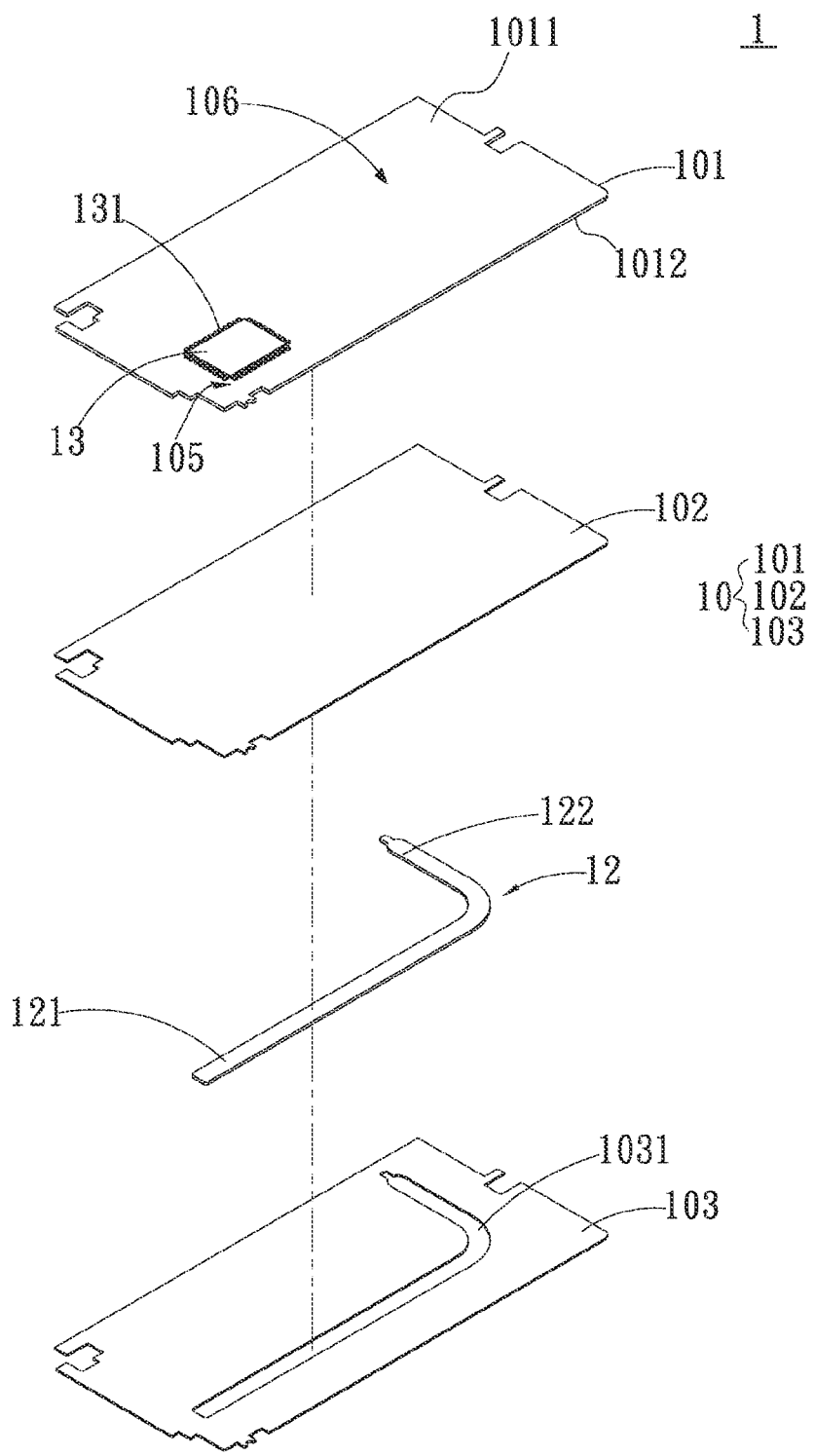
FIG. 4 is an exploded perspective view of an electronic substrate with heat dissipation structure according to a second preferred embodiment of the present invention.
Figure 5:
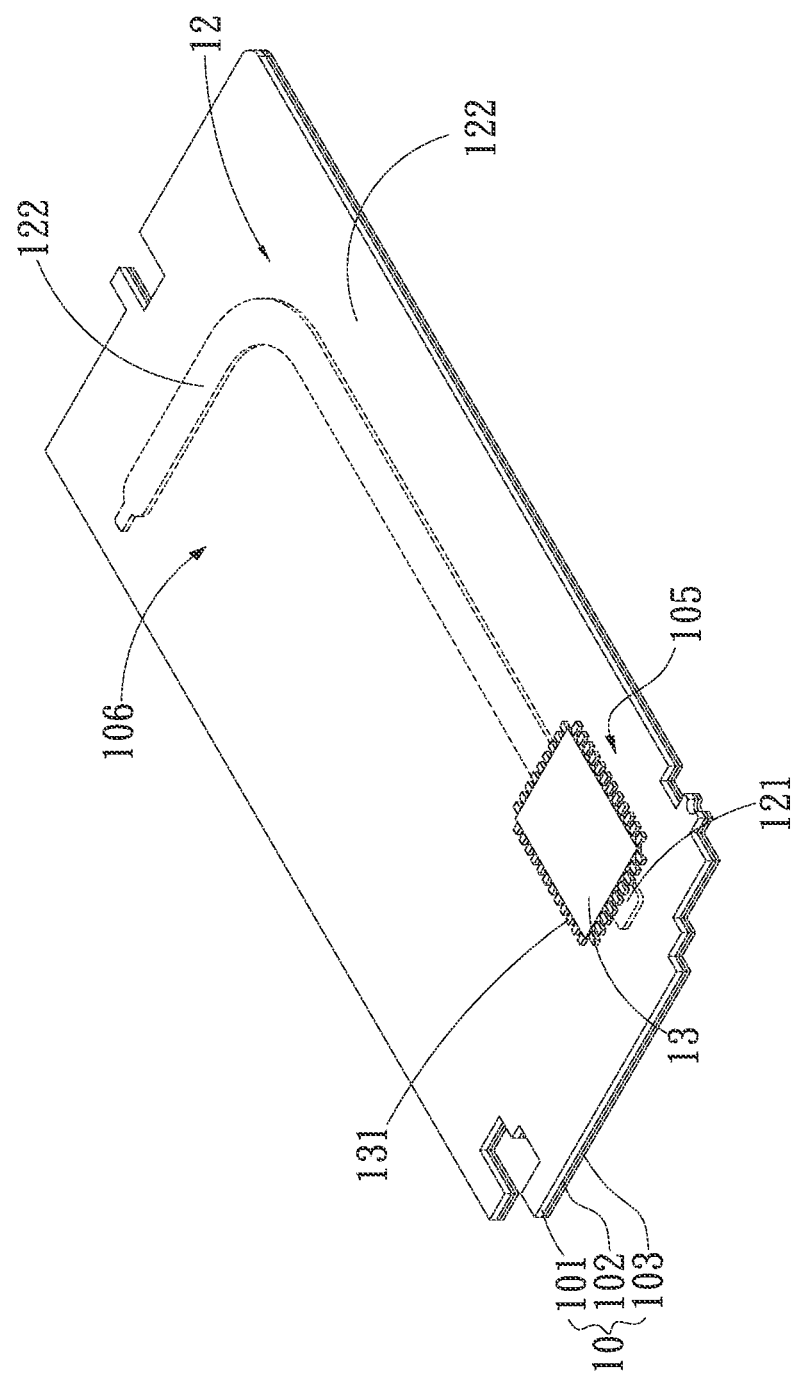
FIG. 5 is an assembled view of FIG. 4.
Figure 6:
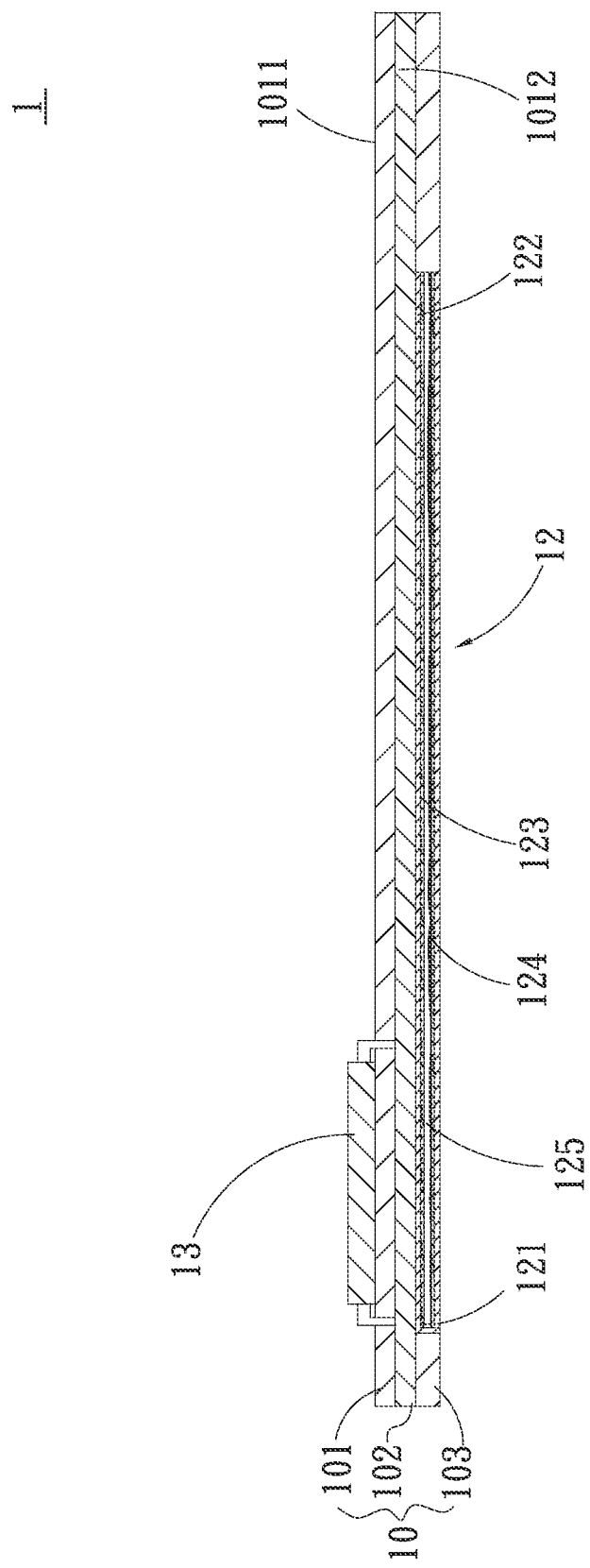
FIG. 6 is a sectional view of FIG. 5.

FIG. 4 is an exploded perspective view of an electronic substrate 1 according to a second preferred embodiment of the present invention, and FIGS. 5 and 6 are assembled perspective and sectional views, respectively, of the second preferred embodiment. As shown, the second preferred embodiment is generally structurally similar to the first preferred embodiment but has a receiving hole 1031 formed on the insulation layer 103 to replace the receiving hole 1014 that is formed on the wiring layer 101 in the first preferred embodiment. Therefore, in the second preferred embodiment, the heat pipe 12 is fitted in the receiving hole 1031 with the grounding layer 102 located between the heat pipe 12 and the heat-producing element 13. More specifically, the receiving hole 1031 is formed on the insulation layer 103 to extend through the latter in a thickness direction thereof, and is extended from a position on the insulation layer 103 corresponding to the heat-producing element 13 to another position on the insulation layer 103 distant from the heat-producing element 13. In other words, as shown in FIG. 4, the receiving hole 1031 on the insulation layer 103 has a beginning end located immediately below the heat-producing element 13 and extends along a longitudinal edge of the insulation layer 103 to a transverse edge of the insulation layer 103 farther away from the heat-producing element 13. The receiving hole 1031 vertically extends through the insulation layer 103 from the upper side of the insulation layer 103 facing toward the grounding layer 102 to the lower side of the insulation layer 103 facing away from the grounding layer 102, and is shaped for receiving the heat pipe 12 therein.

In the second preferred embodiment, the heat pipe 12 received in the receiving hole 1031 has an upper surface in full contact with the lower side of the grounding layer 102, the heat-absorption section 121 of the heat pipe 12 is fitted in a portion of the receiving hole 1031 located below and corresponding to the heat-producing element 13, and the heat-transfer section 122 of the heat pipe 12 is fitted in another portion of the receiving hole 1031 located distant from the heat-producing element 13. That is, the heat-absorption section 121 is fitted in the receiving hole 1031 to locate immediately below or near a bottom of the heat-producing element 13 with the grounding layer 102 located between the heat-absorption section 121 and the heat-producing element 13. On the other hand, the heat-transfer section 122 is fitted in the receiving hole 1031 on the insulation layer 103 to locate distant from the heat-producing element 13 with the grounding layer 102 located between the heat-transfer section 122 and the heat-producing element 13. In other words, the heat-absorption section 121 is located in the receiving hole 1031 at a position corresponding to the high-temperature zone 105 of the wiring layer 101 while the heat-transfer section 122 is located in the receiving hole 1031 at a position corresponding to the low-temperature zone 106 of the wiring layer 101. Therefore, both of the heat-absorption section 121 and the heat-transfer section 122 of the heat pipe 12 have an upper surface flatly attached to the lower side of the grounding layer 102, and a lower surface flush with or slightly lower than the lower side of the insulation layer 103. By fitting the heat pipe 12 in the receiving hole 1031 formed on the insulation layer 103 of the substrate plate 10, it is also able to provide an integral electronic substrate 1 with heat dissipation structure.

Further, since the heat pipe 12 fitted in the receiving hole 1031 on the insulation layer 103 of the substrate plate 10 is extended from a position corresponding to the high-temperature zone 105 surrounding the heat-producing element 13 to a position corresponding to the low-temperature zone 106 farther away from the heat-producing element 13, the present invention according to the second preferred embodiment thereof also enables an electronic device using the electronic substrate 1 to have a slim body that occupies a reduced room while has effectively upgraded heat dissipation efficiency.

The heat-producing element 13 in the second preferred embodiment is generally structurally and functionally similar to that in the first preferred embodiment, and also includes a plurality of leads 131 extended beyond outer edges thereof. Some of the leads 131 are extended through the first and second side surfaces 1011, 1012 of the wiring layer 101 to connect to the upper side of the grounding layer 102, while others not. Again, the grounding layer 102 has its upper side in contact with the second side surface 1012 of the wiring layer 101 and its lower side in contact with the upper side of the insulation layer 103.

When the heat-producing element 13 produces heat, a part of the produced heat that is distributed over the high-temperature zone 105, i.e. the heat-producing element 13 and areas of the wiring layer 101 closely surrounding the heat-producing element 13, is transferred to the adjacent grounding layer 102 via the leads 131 of the heat-producing element 13. The heat-absorption section 121 of the heat pipe 12 located corresponding to the high-temperature zone 105 and in contact with the lower side of the grounding layer 102 absorbs the heat transferred to the grounding layer 102, and the absorbed heat is quickly transferred to the heat-transfer section 122 located distantly from the heat-producing element 13 and corresponding to the low-temperature zone 106. Meanwhile, heat transferred to the heat-transfer section 122 on the insulation layer 103 is then quickly transferred to the low-temperature zone 106 of the substrate plate 10 to dissipate into ambient air. That is, the heat produced by the heat-producing element 13 can be evenly transferred to the whole substrate plate 10, which provides a relatively large area to enable more efficient heat dissipation and accordingly, prevents heat from accumulating on the heat-producing element 13. With the above arrangements, the electronic substrate 1 enables the heat-producing element 13 to have upgraded operation efficiency and extended service life.

According to the second preferred embodiment, the heat-absorption section 121 of the heat pipe 12 is fitted in the receiving hole 1031 formed on the insulation layer 103 of the substrate plate 10 and is located immediately below or near a lower side of the heat-producing element 13 with the grounding layer 102 located between the heat-absorption section 121 and the heat-producing element 13, and the heat transferred from the heat-absorption section 121 to the heat-transfer section 122 can be evenly transferred to the whole substrate plate 10. With this design, an electronic device using the electronic substrate 1 can have a slim body that occupies a reduced room while has effectively upgraded heat dissipation efficiency, and the heat-producing element 13 can have upgraded operating efficiency and extended service life.

Figure 7:
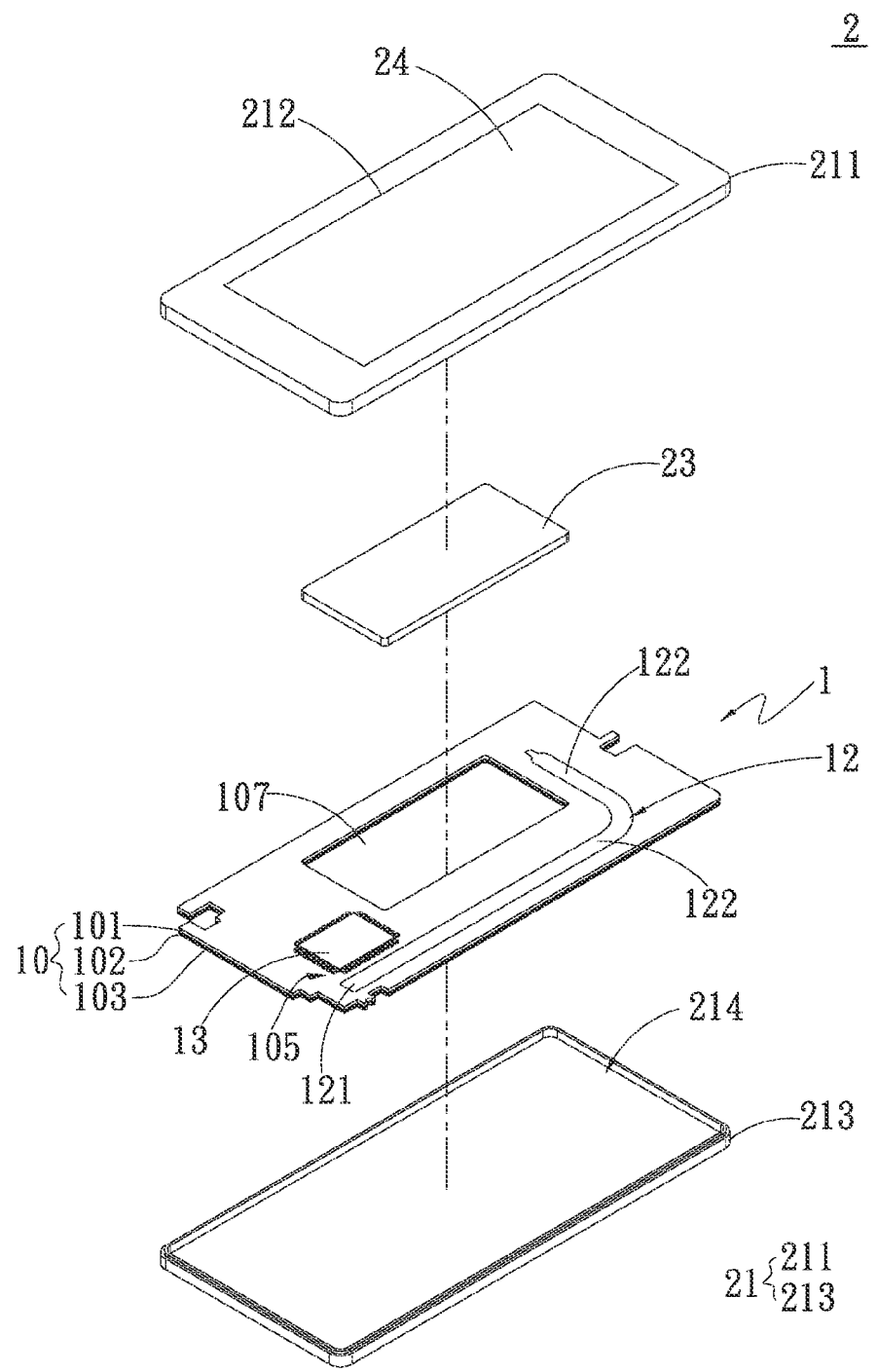
FIG. 7 is an exploded perspective view of a hand-held electronic device according to a third preferred embodiment of the present invention, which uses the electronic substrate according to the first preferred embodiment of the present invention.
Figure 8:
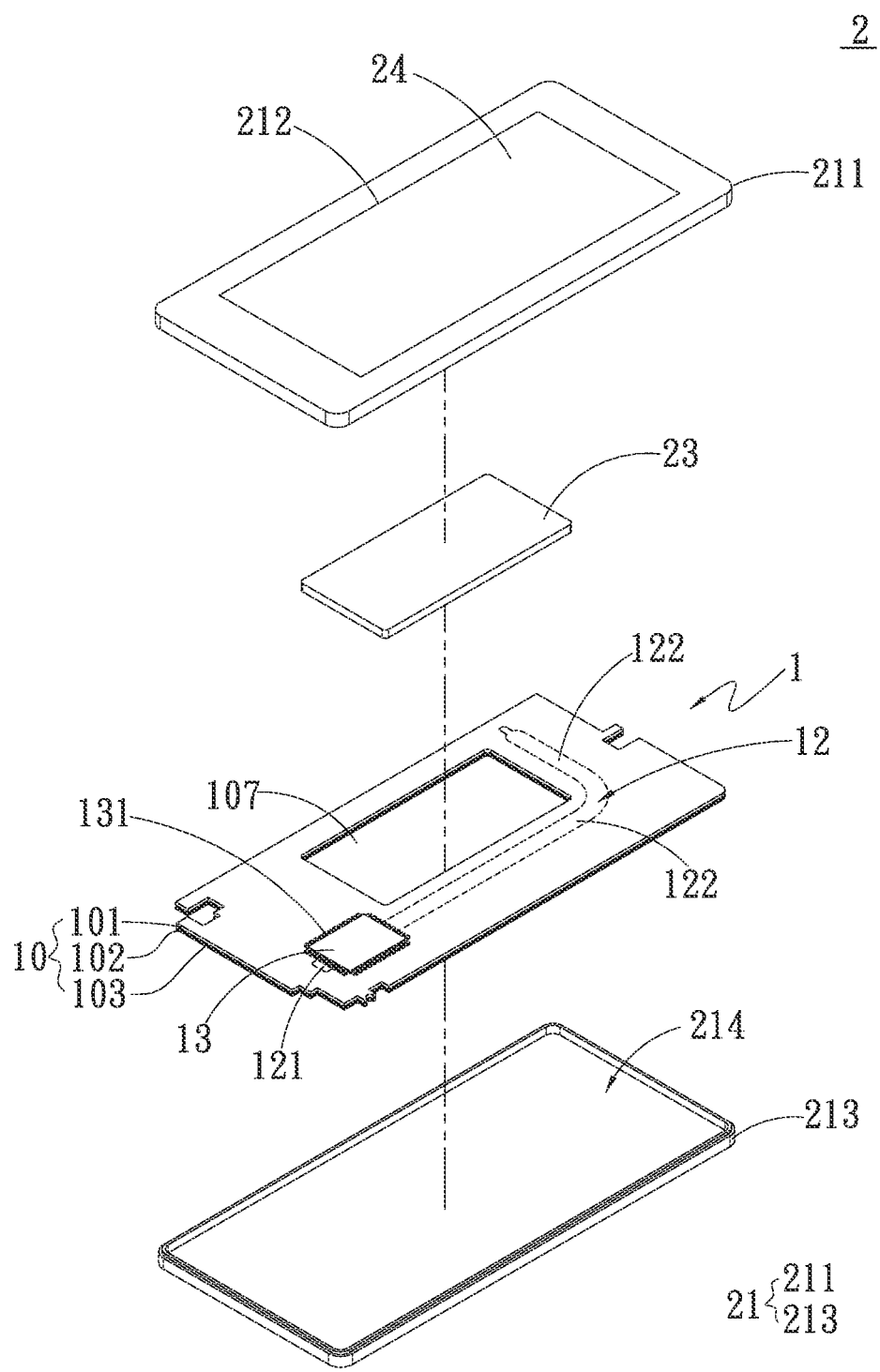
FIG. 8 is another exploded perspective view of a hand-held electronic device according to a third preferred embodiment of the present invention, which uses the electronic substrate according to the second preferred embodiment of the present invention.
Figure 9:
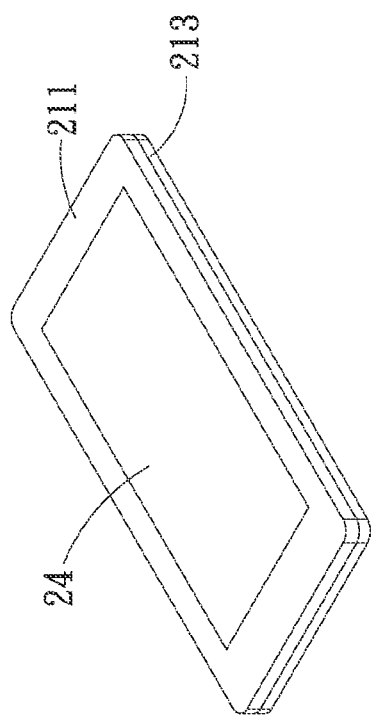
FIG. 9 is an assembled perspective view of the third preferred embodiment of the present invention.

Please refer to FIGS. 7, 8 and 9. FIG. 7 is an exploded perspective view of a hand-held electronic device 2 according to a third preferred embodiment of the present invention, which uses the electronic substrate 1 according to the first preferred embodiment of the present invention; FIG. 8 is another exploded perspective view of the hand-held electronic device 2 according to a third preferred embodiment of the present invention, which uses the electronic substrate 1 according to the second preferred embodiment of the present invention; and FIG. 9 is an assembled perspective view of the hand-held electronic device 2. The hand-held electronic device 2 can be a mobile phone, a tablet computer, a personal digital assistant (PDA), an iPad or the like. While the electronic device 2 according to the third preferred embodiment of the present invention is illustrated herein as a mobile phone, it is understood the electronic substrate 1 of the present invention can also be used with other types of electronic devices, such as a desktop computer, a notebook computer and the like.

The illustrated hand-held electronic device 2 includes a case 21, a battery 23, a touchscreen 24, and the above-described electronic substrate 1. The case 21 is assembled from a front cover 211 and a back cover 213, which together define a receiving space 214 between them for receiving the electronic substrate 1 therein. The front cover 211 is formed with a window 212, within which the touchscreen 24 is mounted. The substrate plate 10 of the electronic substrate 1 is provided with an opening 107, within which the battery 23 is fitted. The opening 107 is located between the heat pipe 12 and another opposite longitudinal edge of the substrate plate 10 farther away from the heat-producing element 13.

By using the electronic substrate 1 in the hand-held electronic device 2, heat produced by the heat-producing element 13 inside the hand-held electronic device 2 can be quickly and evenly transferred to the whole substrate plate 10, which provides an increased heat-dissipation area for the heat transferred thereto to transfer to the case 21 through heat radiation and then quickly dissipate into ambient air without accumulating on the heat-producing element 13. Therefore, the hand-held electronic device 2 can have reduced volume and thickness while having upgraded heat dissipation efficiency, enabling the heat-producing element 13 to have good operating efficiency and extended service life.

Compared to the prior art electronic substrates and electronic devices, the present invention has the following advantages: (1) preventing heat from accumulating on the heat-producing element to thereby enable upgraded heat dissipation efficiency; (2) having reduced thickness to occupy less space; and (3) enabling the heat-producing element to have good operation efficiency and extended service life.

The present invention has been described with some preferred embodiments thereof and it is understood that many changes and modifications in the described embodiments can be carried out without departing from the scope and the spirit of the invention that is intended to be limited only by the appended claims.

What is claimed is:

1. An electronic substrate with heat dissipation structure, comprising: a substrate plate including a wiring layer, a grounding layer and an insulation layer; the wiring layer having a first side surface and an opposite second side surface, and being provided with a receiving hole; the first side surface having at least one heat-producing element mounted thereon, and the receiving hole provided on the wiring layer being extended from a position in the vicinity of the heat-producing element to another position distant from the heat-producing element while vertically extending through the first and the second side surface of the wiring layer; the grounding layer having an upper side facing toward the wiring layer and attached to the second side surface, and a lower side facing away from the wiring layer; and the insulation layer having an upper side facing toward and attached to the lower side of the grounding layer, and a lower side facing away from the grounding layer; and a heat pipe having an upper surface and a lower surface being tightly fitted in the entire receiving hole with the entire lower surface of the heat pipe in full contact with the upper side of the grounding layer; the heat pipe including a heat-absorption section and a heat-transfer section extended from the heat-absorption section; the heat-absorption section being fitted in a portion of the receiving hole located adjacent to the heat-producing element, and the heat-transfer section being fitted in another portion of the receiving hole located distant from the heat-producing element; wherein the upper surface and the lower surface of the heat pipe are flush with the first side surface and the second side surface of the wiring layer, respectively.

2. The electronic substrate with heat dissipation structure as claimed in claim 1, wherein areas of the wiring layer that surround the heat-producing element form at least one high-temperature zone, and other areas of the wiring layer that are located farther away from the heat-producing element form a low-temperature zone; and the heat-absorption section of the heat pipe being located in the high-temperature zone while the heat-transfer section being located in the low-temperature zone.

3. The electronic substrate with heat dissipation structure as claimed in claim 2, wherein the heat-absorption section of the heat pipe is fitted in a portion of the receiving hole located adjacent to one side of the heat-producing element, and both of the heat-absorption section and the heat-transfer section have a lower surface in full contact with the upper side of the grounding layer.

* * * * *